US009000597B2

(12) United States Patent
Huebinger et al.

(10) Patent No.: US 9,000,597 B2
(45) Date of Patent: *Apr. 7, 2015

(54) DUMMY STRUCTURES AND METHODS

(71) Applicant: Infineon Technologies AG, Neubiberg (DE)

(72) Inventors: Frank Huebinger, Dresden (DE); Steffen Rothenhaeusser, Dresden (DE); Kerstin Kaemmer, Dresden (DE)

(73) Assignee: Infineon Technologies AG, Neubiberg (DE)

( * ) Notice: Subject to any disclaimer, the term of this patent is extended or adjusted under 35 U.S.C. 154(b) by 0 days.

This patent is subject to a terminal disclaimer.

(21) Appl. No.: 13/959,485

(22) Filed: Aug. 5, 2013

(65) Prior Publication Data

US 2014/0167184 A1    Jun. 19, 2014

Related U.S. Application Data

(63) Continuation of application No. 13/091,679, filed on Apr. 21, 2011, now Pat. No. 8,501,576.

(51) Int. Cl.
*H01L 29/41* (2006.01)
*H01L 21/28* (2006.01)
*H01L 27/02* (2006.01)
*H01L 21/283* (2006.01)
*H01L 27/088* (2006.01)
*H01L 29/66* (2006.01)

(52) U.S. Cl.
CPC ...... *H01L 21/28008* (2013.01); *H01L 27/0207* (2013.01); *H01L 29/6659* (2013.01); *H01L 21/283* (2013.01); *H01L 27/088* (2013.01)

(58) Field of Classification Search
USPC .............. 257/773, E21.58, E21.159; 438/401
See application file for complete search history.

(56) References Cited

U.S. PATENT DOCUMENTS 8,501,576 B2 *   8/2013   Huebinger et al. ........... 438/401
2002/0162082 A1  10/2002  Cwynar et al.
2009/0087959 A1   4/2009  Ban
2011/0068436 A1   3/2011  Culp et al.

OTHER PUBLICATIONS

Lee, B. et al., "Using Smart Dummy Fill and Selective Reverse Etchback for Pattern Density Equalization," Proc. CMP-MIC, pp. 255-258, Mar. 2000.

* cited by examiner

*Primary Examiner* — Thomas L Dickey
(74) *Attorney, Agent, or Firm* — Slater & Matsil, L.L.P.

(57) ABSTRACT

A semiconductor device and a method of making a semiconductor device are disclosed. The method of manufacturing a semiconductor device comprises forming a material layer on a substrate, patterning a first semi-global region with a first main pattern and patterning a second semi-global region with a second main pattern, wherein the first main pattern is different than the second main pattern. The method further comprises introducing a first dummy pattern in the first semi-global region so that a first sidewall area surface density of the first main pattern and the first dummy pattern in the first semi-global region and a second sidewall area surface density of the second main pattern in the second semi-global region are substantially a same density.

16 Claims, 7 Drawing Sheets

PATTERN 1

PATTERN 2

PATTERN 4x

DUMMY STRUCTURES AND METHODS

This is a continuation application of U.S. application Ser. No. 13/091,679, which was filed on Apr. 21, 2011 (issued as U.S. Pat. No. 8,501,576) and is incorporated herein by reference.

TECHNICAL FIELD

The present invention relates to semiconductor devices and methods of manufacturing semiconductor devices.

BACKGROUND

The fabrication of semiconductor devices such as integrated circuits (ICs) and MEMS may require that certain processes are conducted at uniform rates across the surface of a substrate or wafer. This may be needed despite the fact that layout features and their density may vary from region to region.

SUMMARY OF THE INVENTION

These and other problems are generally solved or circumvented, and technical advantages are generally achieved, by preferred embodiments of the present invention.

In accordance with an embodiment of the present invention, a method of making a semiconductor comprises forming a material layer on a substrate, patterning a first semi-global region with a first main pattern and patterning a second semi-global region with a second main pattern, wherein the first main pattern is different than the second main pattern. The method further comprises introducing a first dummy pattern in the first semi-global region so that a first sidewall area surface density of the first main pattern and the first dummy pattern in the first semi-global region and a second sidewall area surface density of the second main pattern in the second semi-global region are substantially a same density.

In accordance with an embodiment of the present invention, a semiconductor device comprises a first gate pattern and a first dummy pattern in a material layer on a substrate in a first semi-global region, the first gate pattern and the first dummy pattern having a first sidewall area surface density, and a second gate pattern in the material layer on the substrate in a second semi-global region, the second gate pattern having a second sidewall area surface density, wherein the first sidewall area surface density is in a range of +/−35% of the second sidewall area surface density.

BRIEF DESCRIPTION OF THE DRAWINGS

For a more complete understanding of embodiments of the present invention, and the advantages thereof, reference is now made to the following descriptions taken in conjunction with the accompanying drawings, in which.

DETAILED DESCRIPTION OF ILLUSTRATIVE EMBODIMENTS

The making and using of the presently preferred embodiments are discussed in detail below. It should be appreciated, however, that the present invention provides many applicable inventive concepts that can be embodied in a wide variety of specific contexts. The specific embodiments discussed are merely illustrative of specific ways to make and use the invention, and do not limit the scope of the invention.

The present invention will be described with respect to preferred embodiments in a specific context, namely semiconductor devices and in particular transistors. The present invention may also be applied to other devices.

Spacer thickness distribution can vary over a wafer and/or within an individual chip/product. The thickness distribution of the spacers (non-uniformities) depends on various process conditions. One important process condition is the deposition rate which depends on temperatures and pressures. For example, the best spacer uniformities are achieved with a slow deposition rate having a large temperature budget. However, the deposition of spacers cannot be regarded as a single independent event in a device manufacturing process which is taken out of context. Rather, the deposition of spacers is a part of a series of other process steps such as implantation processes, annealing processes, etc. As a result, perfect deposition processes, e.g., very slow and very hot spacer deposition processes, may not be practical.

An additional problem may be that the spacer deposition process needs to cover not only horizontal surfaces of a wafer but also vertical surfaces such as sidewalls of gate stacks. The "to be covered surface" (TBCS) is an important factor for the deposition of spacers under realistic process conditions. It has been found that the spacer thickness distribution depends on the TBCS. The TBCS may be defined as the wafer surface and the sidewall area surfaces of the gate stacks in a given region of the wafer or the chip/product.

The TBCS on a wafer or chip may vary significantly in different regions. For example, kerf regions or analog regions may comprise a small number of devices per area. Accordingly, the TBCS in kerf regions or analog regions may be small and the spacer thicknesses may be large. Standard library regions, e.g. regions having devices based on standard libraries, may comprise a medium number of devices per area. Accordingly, the "to be covered surface" in this region may be medium per area and the spacer thicknesses may also be medium. Memory regions, e.g., SRAM or Flash regions, may comprise a large number of devices per area. Accordingly, the TBCS in the memory regions may be large and the spacer thicknesses may be small. Therefore, the TBCS in a conventional process are typically as follows: In the kerf or analog regions the TBCS may be smaller than the TBCS in the standard library regions and the TBCS in standard library regions may be smaller than the TBCS in memory regions.

Figure 1A:
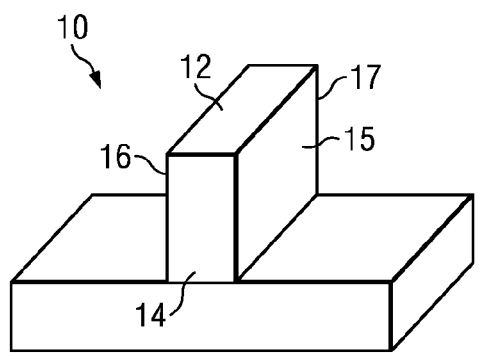
FIG. 1a is an orthographic view of a transistor gate.
Figure 1B:
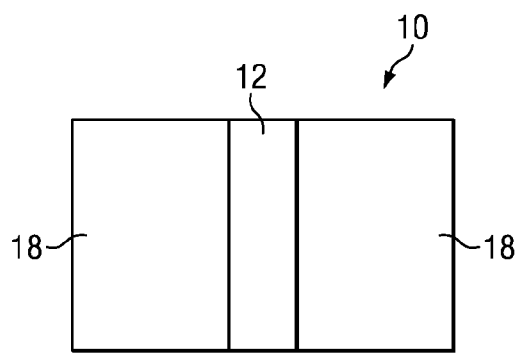
FIG. 1b is a top view of the transistor gate.

A quantitative measure for the TBCS is the sidewall area surface (SWS) of a semi-global region plus the top view surface of the semi-global region. The sidewall area surface may be the sum of the sidewall area surfaces of the devices of the semi-global region. For example, FIG. 1a shows a perspective view of a transistor gate 10 and FIG. 1b shows a top view of the transistor gate 10. As can be seen from FIGS.

1a-1b, the SWS for one transistor is the sum of the four side wall areas, e.g., areas 14-15 and opposite areas 16-17. The SWS for a semi-global region is the sum of the SWSs of all transistors in the semi-global region. The top view surface of a semi-global region may be defined as the top view surface of the wafer in this semi-global region. The top view surface of the semi-global region may be defined as the sum of the top view surfaces of all transistors wherein the top view surface of one transistor comprises the top surfaces 12 and the surrounding surfaces 18.

The thickness of a deposited spacer can be mathematically expressed in equation (1):

$$Th_{Sp}(x, y) \approx \frac{Rate_{Dep}(T, P)}{SWS(x, y) + S_{SGR}}$$

$Th_{Sp}$ is the thickness of the spacer at a certain in-chip coordinate x, y, $Rate_{Dep}$ is the deposition rate, T is the temperature, P is the pressure and $S_{SGR}$ is the top view surface of a semi-global region of a wafer. Equation (1) shows that the thickness of the spacer $Th_{Sp}$ is proportion to the deposition rate $Rate_{Dep}$ and reciprocally proportional to the sum of the sidewall area surface (SWS) and the top view surface of a semi-global region of the wafer $S_{SGR}$. The denominator, $SWS+S_{SGR}$, is the TBCS.

From equation (1) follows that the spacer thickness $Th_{Sp}$ is reciprocally proportional to the SWS. Large sidewall area surfaces lead to small spacer thicknesses $Th_{Sp}$ and small sidewall area surfaces lead to thick spacer thicknesses $Th_{Sp}$.

Figure 2:
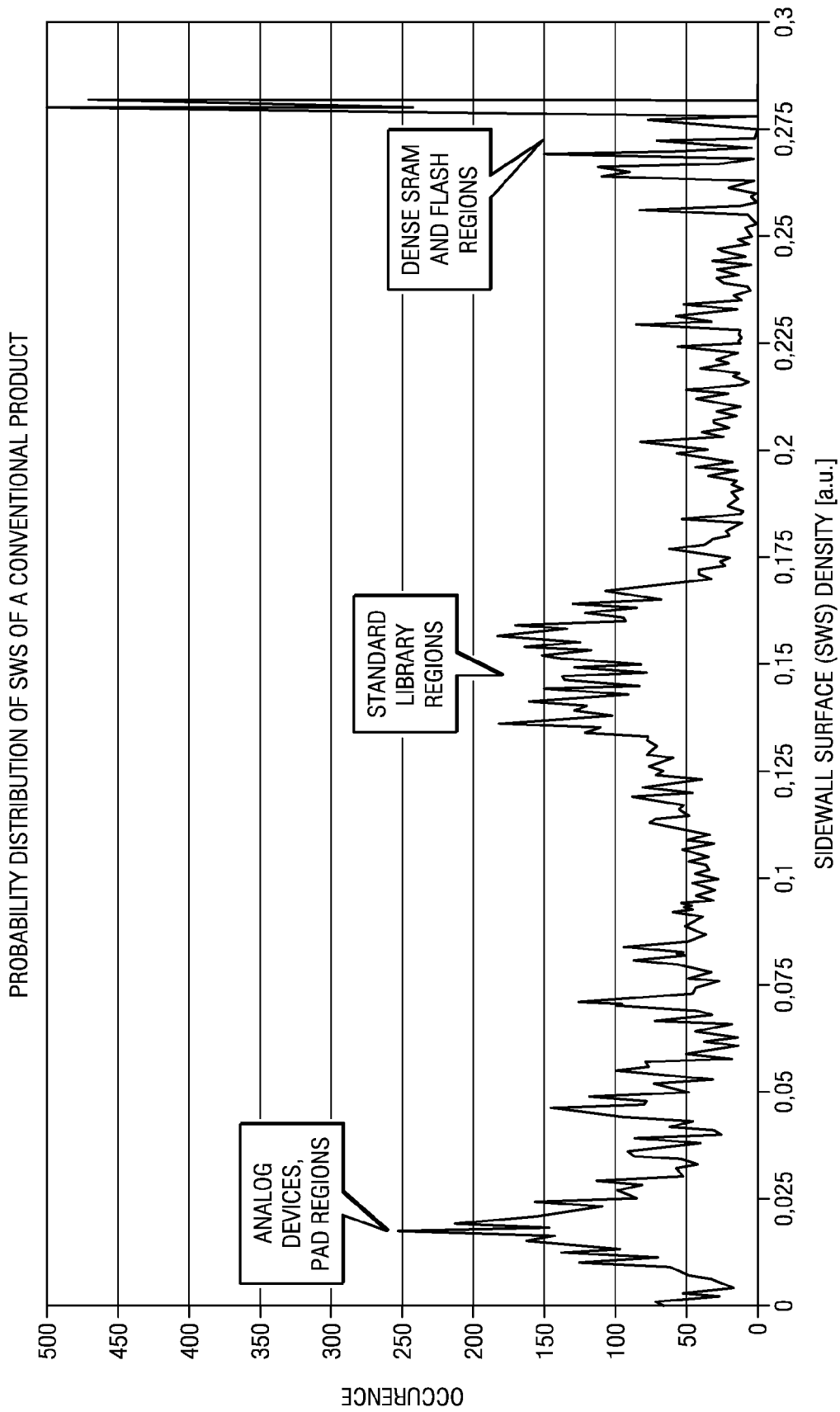
FIG. 2 is a graph of sidewall area surface density distribution of a chip.

FIG. 2 shows an example of a sidewall area surface (SWS) density distribution for a conventional product. The sidewall area surface density is shown along the x-axis in arbitrary units and the occurrence is shown along the y-axis in arbitrary units. As can be seen from FIG. 2 the graph forms three significant peaks. The first peak is formed between a sidewall area surface density of 0 and 0.05. The first top reflects distribution of sidewall area surface (SWS) densities for kerf regions or analog device regions. The second peak is formed between a sidewall area surface (SWS) densities of 0.13 and 0.17. The second peak reflects the distribution of the sidewall area surface (SWS) density for standard library regions. The third top is formed between the sidewall area surface (SWS) densities of 0.25 and 0.3. The third top reflects the distribution of the sidewall area surface (SWS) densities for memory regions. The different sidewall area density (SWS) distributions imply similar spacer thicknesses within these semi-global regions but different spacer thicknesses in different semi-global regions.

Figure 3:
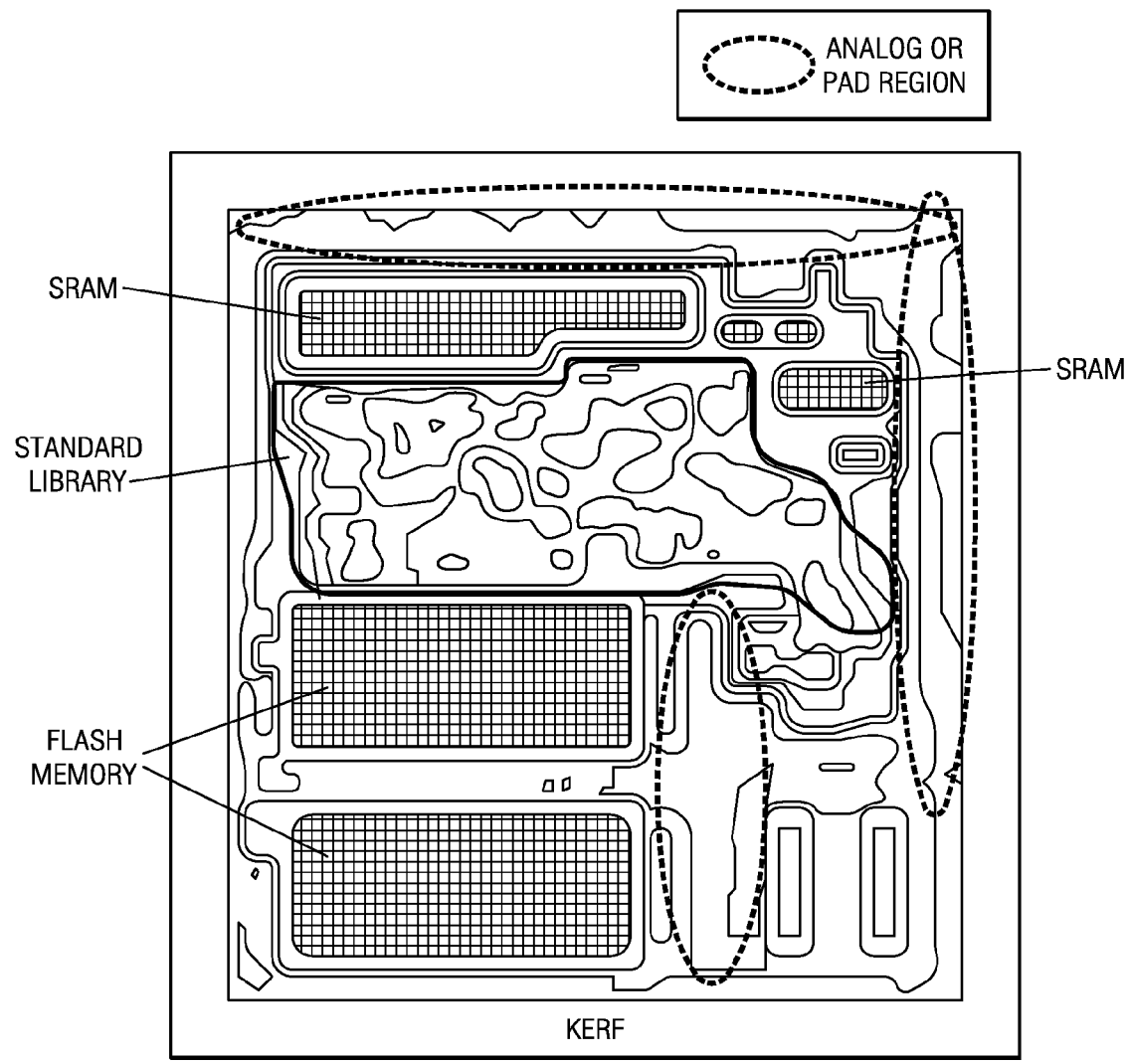
FIG. 3 is a top view of a chip showing semi-global regions.

FIG. 3 shows a conventional product with different sidewall area surface (SWS) densities in different semi-global regions. For example, the product in FIG. 3 includes two flash memory regions, two SRAM regions, a standard library region, an analog region or pad region and a kerf region. The two flash memory regions may comprise SWS densities of 0.26-0.3 and the two SRAM regions may comprise SWS densities of 0.22-0.28. The standard library region may comprise SWS densities of 0.1-0.2 and the analog region or pad region may comprise SWS densities of 0-0.1. FIG. 3 shows a wide distribution of SWS densities over the conventional product and therefore a wide distribution of spacer thicknesses in this product.

Figure 4:
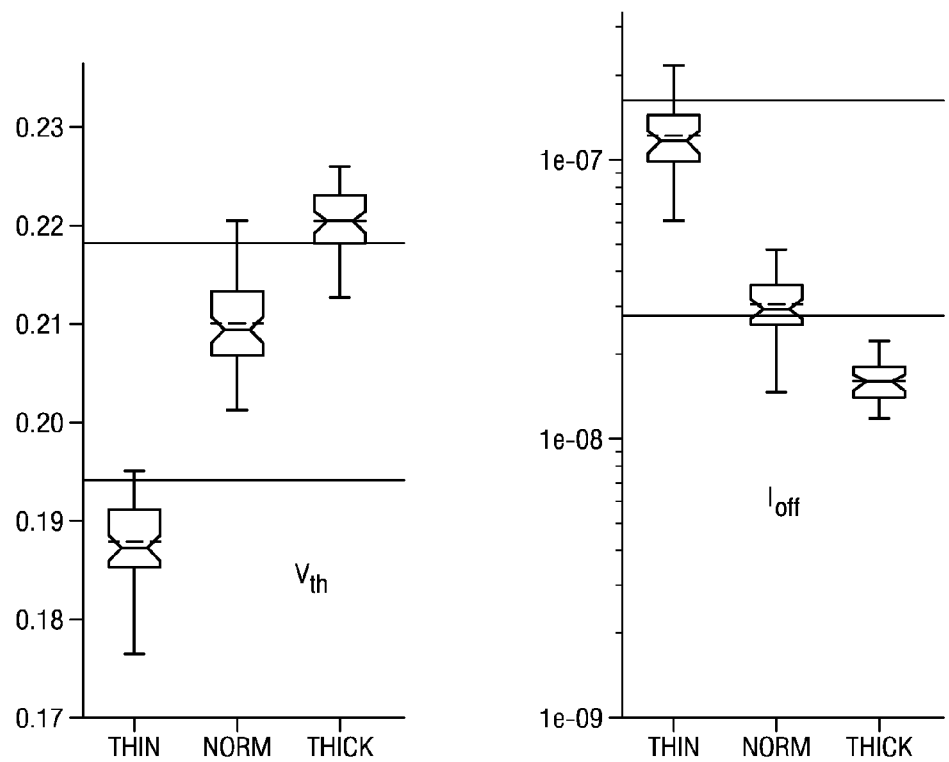
FIG. 4 shows examples of threshold voltages $V_{th}$ and leakage currents $I_{off}$ for a transistor representing different spacer thicknesses.

FIG. 4 shows the impact of different spacer thicknesses on devices. If the spacer thickness is too thin the leakage current $I_{Off}$ of the devices is too high and the threshold voltage $V_{th}$ is distorted. This may be the case for devices in the memory regions. In contrast, if the spacer thickness is too thick the threshold voltage $V_{th}$ is too high and the device is too slow. For example, an analysis of the conventional product in FIG. 3 would reveal that the leakage current $I_{Off}$ of devices in SRAM areas is too large due to too thin spacer thickness in this area.

Embodiments of the invention provide wafers or chips with uniform or more uniform spacer thicknesses. The spacer thickness distribution may be reduced or may be balanced between two semi-global regions. The spacer thickness in one semi-global region may be approximated to or may be substantially the same as the spacer thickness in another semi-global region. A first spacer thickness in one semi-global region may be related to a first sidewall area surface (SWS) density of this first semi-global region. A second spacer thickness in second semi-global region may be related to a second sidewall area surface (SWS) density of this second semi-global region. The sidewall area surface (SWS) densities of the first and second semi-global regions may be approximated to each other. The more similar the sidewall densities are the more similar may be the spacer thicknesses and as a result the more similar may be the device properties.

In one embodiment a first fill pattern in a first semi-global region may increase the first sidewall area surface (SWS) density so that the first sidewall area surface (SWS) density is approximated or substantially the same as the sidewall area surface (SWS) density of a reference semi-global region. The sidewall surface (SWS) area density of the reference semi-global region may be adjusted with an introduction of a second fill pattern or may remain the same by not introducing a second fill pattern.

In one embodiment the sidewall area surface (SWS) density may be optimized by increasing the sidewall area surface (SWS) for a given pattern density. The sidewall area may be increased by providing more and smaller dummy structures while substantially maintaining the pattern density of the material layer on the wafer or the chip.

A more equal distribution of sidewall area surfaces for two different semi-global regions may be achieved by fundamental design changes of chips or products. However, these design changes are often not possible. An advantage of embodiments of the present invention is a more equal distribution of sidewall area surfaces for two semi-global regions without changing the design of the chip or product. A further advantage of embodiments is that the sidewall area surface (SWS) density distribution is substantially the same over significant parts of the product/chip even though the design of the chip or product is not changed.

The variation of spacer thicknesses over several regions on a wafer or a chip/product may be substantially reduced by introducing additional dummy or fill structures and/or by optimizing existing dummy structures. The dummy structures may be introduced or optimized in a material layer. Dummy structures may be introduced or optimized in one semi-global region but not in another semi-global region. Dummy structures may be introduced or optimized in a first semi-global region to a first extend and in a second semi-global region to a second extend.

A semi-global region may be a kerf region, an analog or pad region, a standard library region, a volatile memory region, a non-volatile memory region or the like. In one embodiment, the semi-global regions may be a region having a specific size. For example, the region may be 300 μm×300 μm. Semi-global regions may be smaller or larger depending on the chip/product as well as on the deposition process. The region may be 200 μm×200 μm or may be 400 μm×400 μm.

A kerf region may be the kerf or a region in the kerf. Typically, only a few devices may be located in the kerf. An analog device region may be a region comprising only analog devices or may be a region comprising analog and digital devices. The analog device region has typically only a small number of devices. A standard library region comprises digital devices. The standard library region has typically a medium number of devices. A volatile memory region comprises volatile storage devices such as SRAMs. The volatile memory region is typically densely packed with these volatile storage devices. The non-volatile memory region comprises non-volatile storage devices such a flash memory cells. The non-volatile memory region is typically densely packed with these non-volatile storage devices and may be even denser packed than the volatile memory device region.

Table 1 below shows examples of three different fill patterns for a semi-global region. The pattern density of all patterns in the gate layer is approximately the same, e.g., 24% for pattern 1 and 20% for pattern 2 and 3. However, the sidewall area surface (SWS) density is substantially different for the different patterns. As can be seen from Table 1 the sidewall area surface (SWS) density can be dramatically increased even though the pattern density itself is approximately the same. Adding the fill pattern to a main pattern (e.g., a gate pattern) of a semi-global region can increase the overall sidewall area surface (SWS) density of this semi-global region.

TABLE 1

|  | Pattern 1 | Pattern 2 | Pattern 3 |
| --- | --- | --- | --- |
| Active Area Pattern Density | 45% | 45% | 45% |
| Active Area Size μm | 1.5 × 1.5 | 0.6 × 0.6 | 3.0 × 1.5 |
| Gate Pattern Density | 24% | 20% | 20% |
| Gate Size μm | 1.1 × 1.1 | 0.4 × 0.4 | 0.18 × 1.3 |
| Gate SWS Density | 0.04 | 0.1 | 0.15 |

Figure 5A:
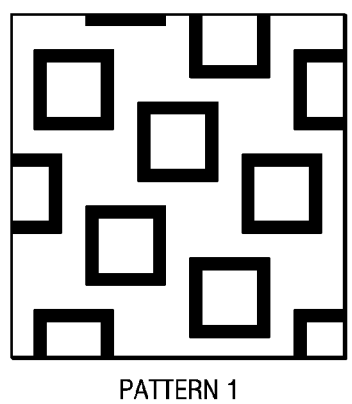
FIG. 5a-5d show dummy structure patterns.
Figure 5B:
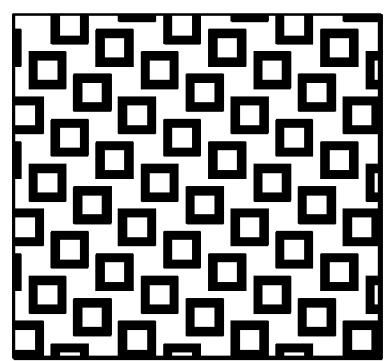
Figure 5C:
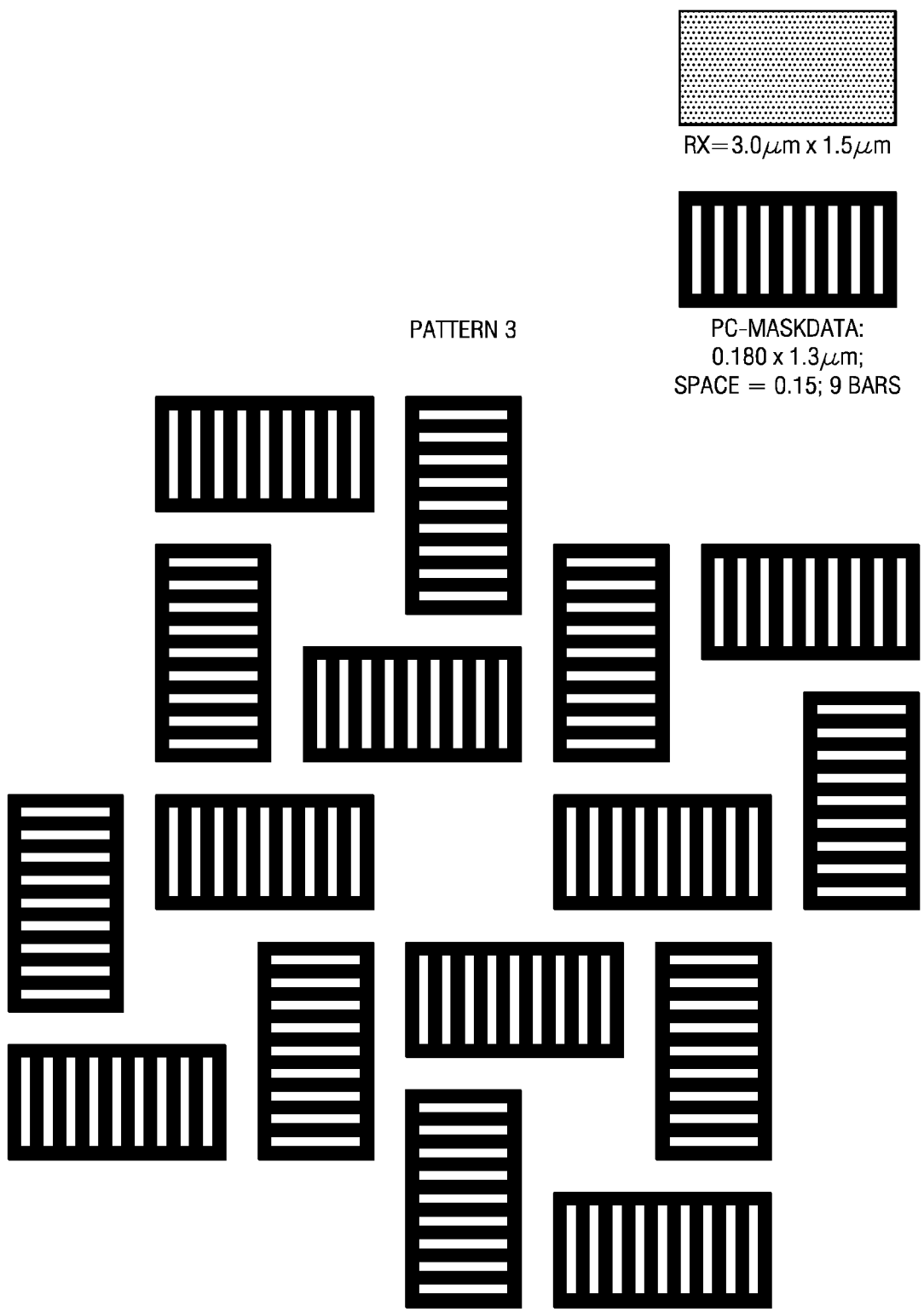

FIGS. 5a-5c show dummy structures related to the fill pattern of Table 1. FIG. 5a shows a conventional dummy structure. The dummy structure of this pattern forms relatively large squares. The active area size is 1.5 μm×1.5 μm and the size of the dummy structures is 1.1 μm×1.1 μm. The gate pattern density is 24% and the sidewall area surface (SWS) density is 0.04. FIG. 5b also shows a pattern of square dummy structures. The pattern of FIG. 5b has a smaller top area surface than the squares in FIG. 5a. The active area size is 0.6 μm×0.6 μm and that the size of the dummy structures is 0.4 μm×0.4 μm. The gate pattern density is 20% and the sidewall area surface (SWS) density is 0.1. The dummy structure in FIG. 5b increases the sidewall area surface (SWS) density about 150% relative to the dummy structure in FIG. 5a even though the first pattern comprises almost the same pattern density than the second pattern.

Figure 6:
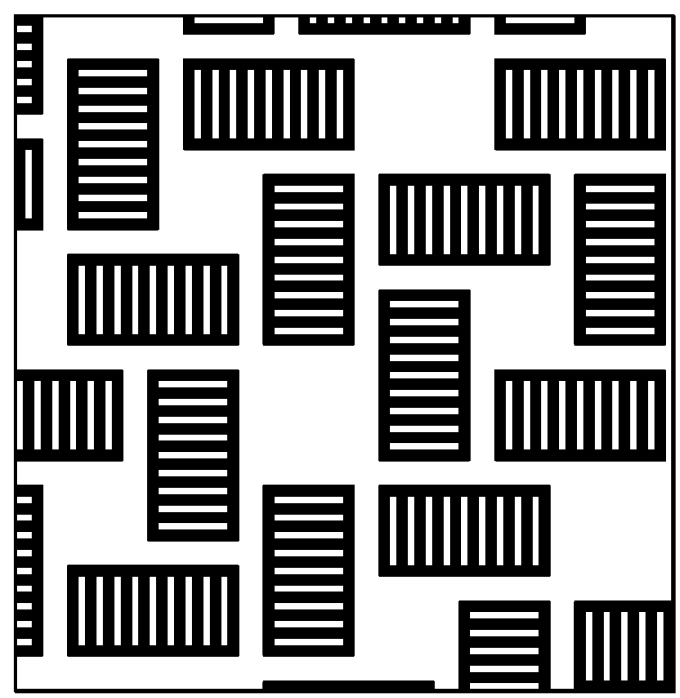
FIG. 6 shows a scanning electron microscope (SEM) picture of an embodiment of a dummy structure.

FIG. 5c shows a pattern of a dummy structure wherein the dummy structures comprise a thin rectangular size. The dummy structures form a striped pattern. The dummy structures have the size of 0.18 μm×1.3 μm. The gate pattern density is 20% and the sidewall area surface (SWS) density is 0.15. The dummy structure pattern of FIG. 5c increases the sidewall area surface (SWS) density about 370% relative to the dummy structure pattern of FIG. 5a with almost the same gate pattern density. FIG. 6 shows a scanning electron microscope (SEM) picture of the dummy structures of FIG. 5c after the gate layer has been etched.

Figure 5D:
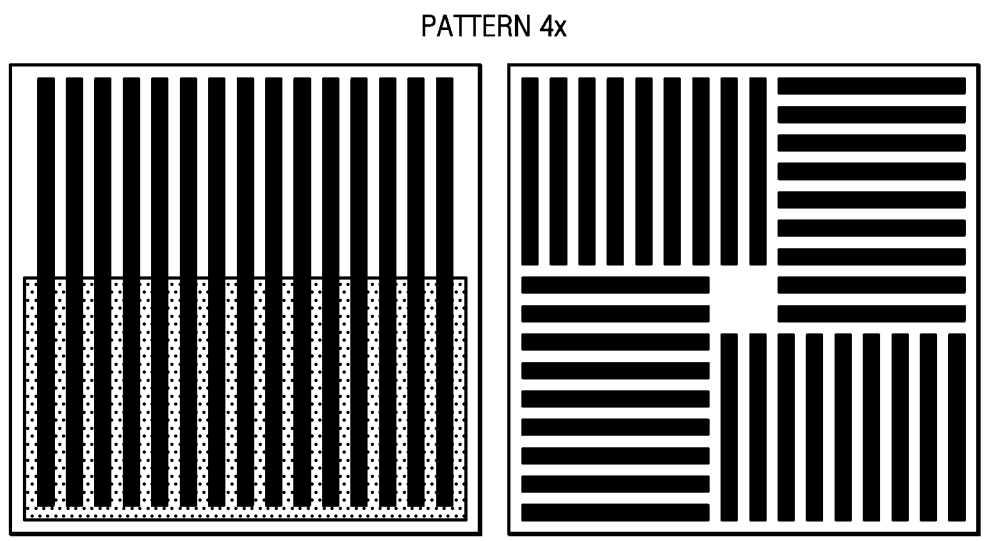

As shown in FIG. 5c, dummy structures may be placed only over active areas and not over isolation areas. Placing the dummy structures over the active areas only may have the advantage that they can be placed on a single layer level and not on two different layer levels. In one embodiment and as shown on the left side of FIG. 5d, the dummy structures may be arranged over the active areas and isolation areas such as field oxides or shallow trench isolations (STIs). The right side of FIG. 5d shows a closely arranged dummy pattern independent of its direction. In one embodiment the dummy structures are only arranged over the isolation areas (not shown).

The dummy structures may comprise any form which may increase the sidewall area surface of dummy structures. In one example, the dummy structure may comprise the form of a hook formed by two rectangular structures attached to each other. In another example, the dummy structure may be an equilateral cross or a cross with different dimensions.

Figure 7:
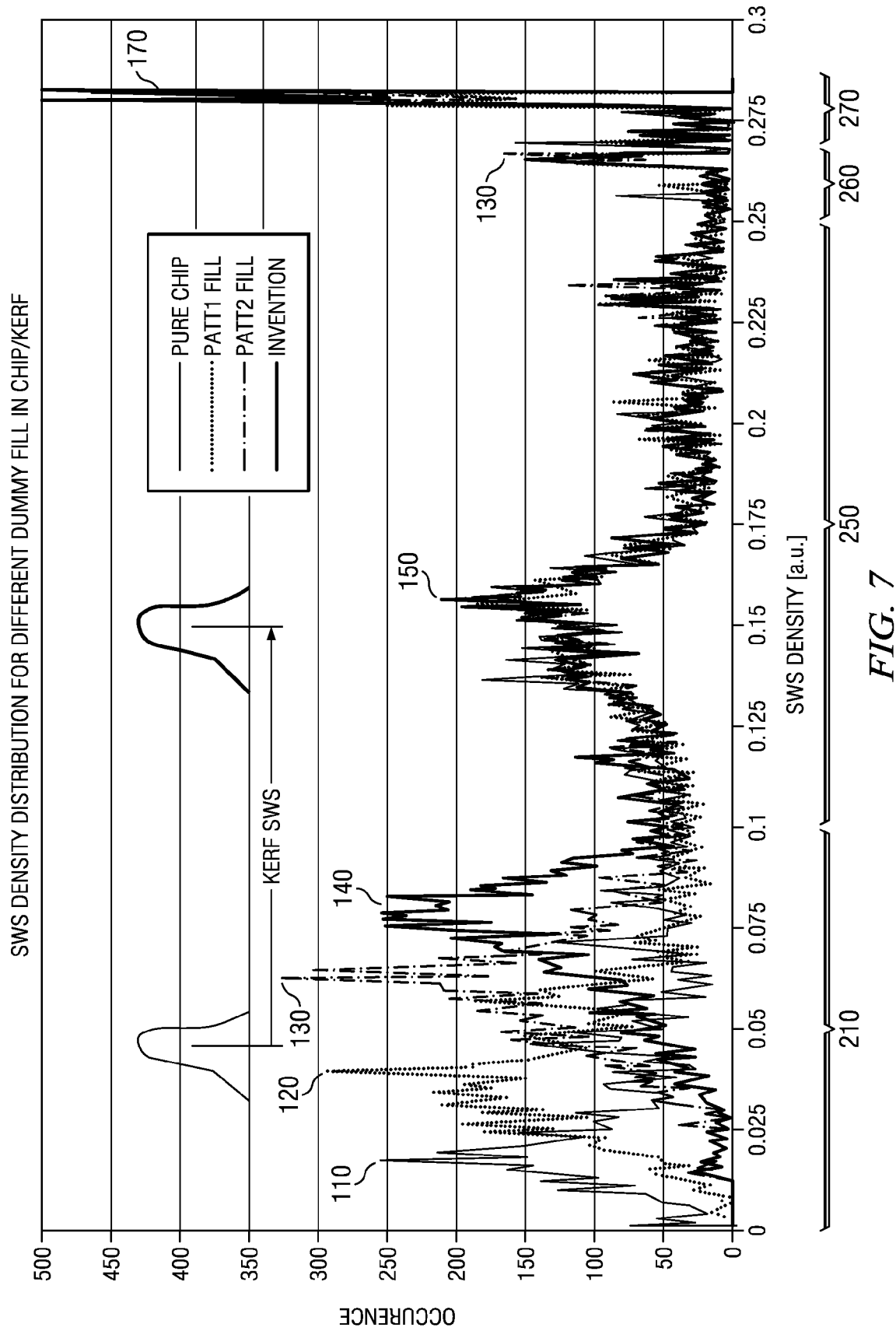
FIG. 7 is shows graphs of embodiments of sidewall area density distributions of a chip.

FIG. 7 shows four graphs of a chip/product having the same semi-global regions but different dummy fill patterns. The area 210 around the first peak of each graph 110-140 reflects the analog or pad region of the chip/product. The area 250 around the second peak 150 reflects the standard library region in the chip/product. The area 260 around the third peak 160 reflects a volatile memory region in the chip/product and the area 270 around the fourth peak 170 reflects a non-volatile memory region in the chip/product. As can be seen from FIG. 7 the sidewall area surface (SWS) density for the peak 150 of the standard library region is about 0.155 and is substantially the same for all graphs 110-140. Similarly the sidewall area surface (SWS) density for the peak 160 of the volatile region is about 0.265 and for the peak 170 of the non-volatile region is about 0.28, and is substantially the same for all graphs 110-140. These areas 250-270 typically do not contain a fill.

Graph 110 shows the distribution of the sidewall area surface (SWS) density for a device having no fill or dummy structures in the analog or kerf region. The peak value of graph 110 is at the low end of the density distribution at a sidewall area surface (SWS) density of roughly 0.012. The density distribution of graph 110 would result in very non-uniform spacer thickness distribution for the different semi-global regions.

Graph 120 shows the distribution of the sidewall area surface (SWS) density of a device having a pattern comprising the dummy fill pattern shown in FIG. 5a. The peak value of the graph 120 is moved towards higher sidewall area surface (SWS) density numbers relative to graph 110. The sidewall area surface (SWS) density is roughly 0.04. Such a sidewall area surface (SWS) density distribution would result in a better spacer thickness distribution than that of graph 110 for the different semi-global regions.

Graph 130 shows the distribution of the sidewall area surface (SWS) density of a device having a pattern comprising the fill pattern shown in FIG. 5b. The peak value of the graph 130 is at a density of roughly 0.07; a substantial improvement over the peak values shown for graphs 110-120.

Graph 140 shows the distribution of the sidewall area surface (SWS) density of a device having a pattern comprising the fill pattern shown in FIG. 5c. The peak value of the analog and pad region for graph 140 is at a density of roughly 0.09 a substantial improvement over the peak values shown for graphs 110-120.

The upper insert of FIG. 7 shows the SWS distribution of the kerf region, on the left with dummy fill pattern 1 and on the right with pattern 3, from FIGS. 5a and 5b respectively. Introduction of pattern 3 reveals, that devices placed into the kerf would match devices of the standard library region 250, due to matching its SWS. The usage of such embodiment of the invention in kerf regions would allow a very close monitoring of the standard library elements placed in the product, presumably within less than 5%.

In one embodiment a fill pattern is added to a first main pattern of a first semi-global region so that the fill pattern and the first main pattern combined have a sidewall area surface (SWS) density which is substantially the same as the sidewall area surface (SWS) density of a second pattern of a second semi-global region. A fill pattern can be added to a kerf main pattern so that the sidewall area surface (SWS) density of the kerf region is substantially the same as the sidewall area surface (SWS) density of the main pattern of the standard library region. For example, the fill pattern for the kerf region may be pattern 3 of FIGS. 5c, 6. Substantially the same may be exactly the same or within about a 5% range.

In one embodiment a first sidewall area surface (SWS) density of a first fill and main pattern of a first semi-global region may only approximate a second sidewall area surface (SWS) density of a second main and/or second fill pattern of a second semi-global region. The approximation of the first sidewall area surface (SWS) density may be within about 25% to about 35% or less of the second sidewall area surface (SWS) density. For example, a fill pattern can be added to a main pattern of an analog or pad region so that the sidewall area surface (SWS) density of the analog or pad region is within about 25% to about 35% or less of the sidewall area surface (SWS) density of the main pattern of the standard library region.

In one embodiment, the sidewall area surface (SWS) density of the standard library region may be increased with a fill pattern. Under such conditions, the sidewall area surface (SWS) density of a first semi-global region may substantially match the increased sidewall area surface (SWS) density of the standard library region.

The convergence of the sidewall area surface (SWS) density for graphs 130 or 140 in the analog/pad or kerf region and the standard library region provides spacers having (more) uniform thicknesses in the analog/pad/kerf region and the standard library region. The dummy pattern of FIG. 5c resulted in a spacer thickness distribution that reduced the leakage current of the test product by about 20% and that improved device parameters, e.g., $V_{th}$, of the kerf devices relative to on-chip devices to an offset of below about 10%. Further test results show that the spacer spread was reduced by at least 50% and that the overall product power consumption was reduced by at least 40%.

The sidewall area surface (SWS) density of the standard library region may be substantially the same for typically standard libraries of one single technology node. The sidewall area surface (SWS) density of the standard library regions may be different for different technology nodes. In an embodiment the sidewall area surface (SWS) density of a standard library region may be increased by introducing dummy fill pattern in the standard library region to move the sidewall area surface (SWS) density of the standard library region towards the sidewall area surface (SWS) densities of the memory regions.

Figure 8:
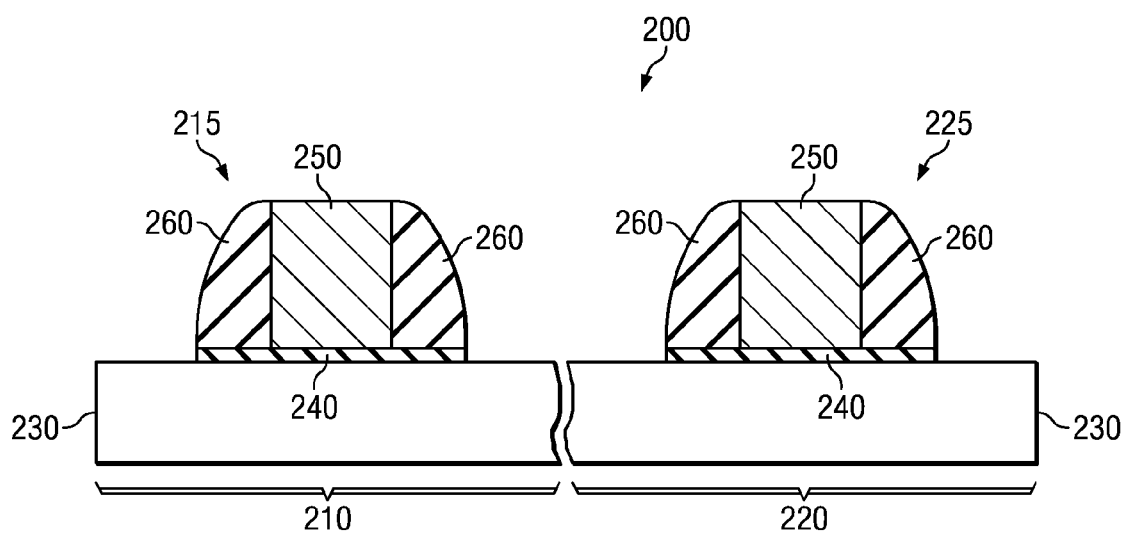
FIG. 8 shows a transistor in the first semi-global region and a transistor in the second semi-global region having a substantially same spacer thickness.

FIG. 8 shows a transistor arrangement 200. The transistor arrangement 200 comprises a first transistor 215 in a first semi-global region 210 and a second transistor 225 in a second semi-global region 220. For example, the first transistor 215 may be a transistor in an analog region and the second transistor 225 may be a transistor in a standard library region. The transistors comprise substantially the same spacer thicknesses. The transistor 215 in the first semi-global region 210 was formed using Pattern 3 of FIG. 5c as a dummy structure for the gate level layer.

The substrate 230 in FIG. 8 may be a semiconductive material such as silicon, germanium, gallium arsenide (GaAs), or the like. The substrate may be bulk silicon, silicon-on-insulator (SOI) or silicon on nothing (SON). A gate dielectric 240 may be disposed above the substrate 230. The gate dielectric 240 may be silicon oxide, silicon nitride or a high-k dielectric material. For example, the high-k dielectric material may be hafnium silicate, zirconium silicate, hafnium oxide, zirconium oxide, aluminum oxide, tantalum oxide, titanium oxide, yttrium oxide and the like. A gate material 250 may be disposed over the gate dielectric 240. The gate material may comprise polysilicon, FUSI or a metal. The metal may comprise tantalum, titanium, molybdenum, platinum, aluminum, hafnium, ruthenium or the like.

Adjacent the gate stack sidewall spacers 260 may be disposed. First sidewall spacers may be disposed in order to implant lightly doped regions and/or halo regions and the second sidewall spacers may be disposed to implant the source/drain regions. The sidewall spacers 260 may be first sidewall spacers and/or second sidewall spacers. Embodiments of the invention may be used to deposit the first sidewall spacers and/or the second sidewall spacers.

The thicknesses of the sidewall spacers 260 may be uniform over the first semi-global region 210 and the second semi-global region 220. The thicknesses of the sidewall spacers 260 may be approximately uniform over the first semi-global region 210 and the second semi-global region 220. The differences of the thicknesses of the sidewall spacers 260 may be in the ranges discussed above. The thickness of the sidewall spacers 260 may depend on the sidewall area densities in the first semi-global region 210 and the second semi-global region 220.

Embodiments of the invention are shown with regard to the deposition of spacers, however, embodiments of the invention may also be applied to any deposition of liners, thin films on structured surfaces, e.g. gate stacks, metal lines or other.

Although the present invention and its advantages have been described in detail, it should be understood that various changes, substitutions and alterations can be made herein without departing from the spirit and scope of the invention as defined by the appended claims.

Moreover, the scope of the present application is not intended to be limited to the particular embodiments of the process, machine, manufacture, composition of matter, means, methods and steps described in the specification. As one of ordinary skill in the art will readily appreciate from the disclosure of the present invention, processes, machines, manufacture, compositions of matter, means, methods, or steps, presently existing or later to be developed, that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

What is claimed is:

1. A semiconductor device comprising:
    a first gate pattern and a first dummy pattern in a material layer on a substrate in a first semi-global region, the first gate pattern and the first dummy pattern having a first sidewall area surface density; and
    a second gate pattern in the material layer on the substrate in a second semi-global region, the second gate pattern having a second sidewall area surface density, wherein the first sidewall area surface density is in a range of 5% of the second sidewall surface density.

2. The semiconductor device according to claim 1, wherein the first semi-global region is an analog or pad region and wherein the second global region is a standard library region.

3. The semiconductor device according to claim 1, wherein the first dummy pattern is arranged on active areas and isolation areas.

4. The semiconductor device according to claim 1, wherein the first dummy pattern is independent of a direction.

5. A method for manufacturing a semiconductor device, the method comprising:
  forming a material layer on a substrate;
  patterning a first semi-global region with a first main pattern;
  patterning a second semi-global region with a second main pattern, wherein the first main pattern is different than the second main pattern; and
  introducing a first dummy pattern in the first semi-global region so that a first sidewall area surface density of the first main pattern and the first dummy pattern in the first semi-global region and a second sidewall area surface density of the second main pattern in the second semi-global region are substantially a same density, wherein the first dummy pattern is arranged on active areas and isolation areas.

6. The method according to claim 5, wherein the first semi-global region is selected from the group consisting of: a kerf region, an analog or pad region, a volatile memory region and a non-volatile memory region, and wherein the second semi-global region is a standard library region.

7. The method according to claim 5, wherein introducing the first dummy pattern substantially maintains an average pattern density of a wafer or a chip.

8. The method according to claim 5, wherein the first dummy pattern is independent of a direction.

9. The method according to claim 5, wherein the first sidewall area surface density is within a 5% range of the second sidewall area surface density.

10. A method for making sidewall spacers, the method comprising:
  providing a pattern density for a material layer in a first semi-global region and a second semi-global region;
  increasing a first sidewall area surface density in the first semi-global region; and
  maintaining a second sidewall area surface density in the second semi-global region, wherein the first sidewall area surface density is within a 5% range of the second sidewall area surface density.

11. The method according to claim 10, wherein first sidewall spacers in the first semi-global region and second sidewall spacers in the second semi-global region are substantially a same thickness.

12. The method according to claim 10, wherein the material layer comprises a polysilicon gate layer or a metal gate layer.

13. The method according to claim 10, wherein the first semi-global region is a kerf region or an analog and pad region, and wherein the second semi-global region is a standard library region.

14. The method according to claim 10, further comprising forming the sidewall spacers in the first semi-global region and in the second semi-global region.

15. A method for manufacturing a semiconductor device, the method comprising:
  forming a material layer on a substrate;
  patterning a first semi-global region with a first main pattern;
  patterning a second semi-global region with a second main pattern, wherein the first main pattern is different than the second main pattern;
  introducing a first dummy pattern in the first semi-global region so that a first sidewall area surface density of the first main pattern and the first dummy pattern in the first semi-global region and a second sidewall area surface density of the second main pattern in the second semi-global region are substantially a same density; and
  introducing a second dummy pattern in the second semi-global region so that the second main pattern and the second dummy pattern form the second sidewall area surface density.

16. A method for manufacturing a semiconductor device, the method comprising:
  forming a material layer on a substrate;
  patterning a first semi-global region with a first main pattern;
  patterning a second semi-global region with a second main pattern, wherein the first main pattern is different than the second main pattern;
  introducing a first dummy pattern in the first semi-global region so that a first sidewall area surface density of the first main pattern and the first dummy pattern in the first semi-global region and a second sidewall area surface density of the second main pattern in the second semi-global region are substantially a same density, wherein the first dummy pattern comprises groups of 9 bars, each bar having a dimension of 0.18 μm×1.3 μm.

* * * * *